(12) United States Patent  
Uehara et al.

(10) Patent No.: US 9,511,535 B2  
(45) Date of Patent: Dec. 6, 2016

(54) RESIN MOLD, PRODUCTION METHOD THEREOF, AND USE THEREOF

(75) Inventors: Satoshi Uehara, Sayama (JP); Takahide Mizawa, Sayama (JP)

(73) Assignee: Soken Chemical & Engineering Co., Ltd., Tokyo (JP)

( * ) Notice: Subject to any disclaimer, the term of this patent is extended or adjusted under 35 U.S.C. 154(b) by 716 days.

(21) Appl. No.: 13/814,310

(22) PCT Filed: Aug. 3, 2011

(86) PCT No.: PCT/JP2011/067769  
§ 371 (c)(1),  
(2), (4) Date: Feb. 5, 2013

(87) PCT Pub. No.: WO2012/018045  
PCT Pub. Date: Feb. 9, 2012

(65) Prior Publication Data  
US 2013/0134622 A1 May 30, 2013

(30) Foreign Application Priority Data

Aug. 6, 2010 (JP) ................................. 2010-177601

(51) Int. Cl.  
*B29C 59/02* (2006.01)  
*B29C 33/42* (2006.01)  
(Continued)

(52) U.S. Cl.  
CPC ............. *B29C 59/002* (2013.01); *B29C 33/62* (2013.01); *B82Y 10/00* (2013.01); *B82Y 40/00* (2013.01); *G03F 7/0002* (2013.01); *B29C 33/40* (2013.01); *B29C 33/424* (2013.01); *B29C 43/003* (2013.01); *B29C 43/08* (2013.01); *B29C 43/085* (2013.01); *B29C 59/026* (2013.01); *B29C 59/046* (2013.01);  
(Continued)

(58) Field of Classification Search  
CPC ....... B82Y 40/00; B82Y 30/00; B82Y 99/00; B29C 2059/023; B29C 59/026; B29C 59/046; B29C 43/003; B29C 2043/023; B29C 2043/025; B29C 43/08; B29C 43/085  
See application file for complete search history.

(56) References Cited

U.S. PATENT DOCUMENTS

2004/0202865 A1  10/2004  Homola et al.  
2007/0100072 A1   5/2007  Akitomo et al.  
(Continued)

FOREIGN PATENT DOCUMENTS

CN   1544523 A   11/2004  
CN   1798811 A   7/2006  
(Continued)

*Primary Examiner* — Linda L Gray  
(74) *Attorney, Agent, or Firm* — The Webb Law Firm

(57) ABSTRACT

A resin mold includes a resin layer having a depressions and protrusions pattern formed in the surface thereof, and a release layer including a mold release agent and formed of uniform thickness on at least the depressions and protrusions pattern of the aforementioned resin layer. The aforementioned resin layer has a solvent soluble resin, and an additive that has bleeding ability with respect to the solvent soluble resin, has a substituent group capable of coupling with the aforementioned mold release agent, and has a substituent group having compatibility with the aforementioned solvent soluble resin. The aforementioned additive is localized in the vicinity of the aforementioned resin layer surface. The group of the additive capable of coupling with the mold release agent condenses with the aforementioned mold release agent so that the aforementioned resin layer and release layer are bonded together.

15 Claims, 4 Drawing Sheets

(51) Int. Cl.
- *B29C 33/44* (2006.01)
- *B29C 33/62* (2006.01)
- *B29C 59/00* (2006.01)
- *B82Y 10/00* (2011.01)
- *B82Y 40/00* (2011.01)
- *G03F 7/00* (2006.01)
- *B29C 43/08* (2006.01)
- *B29C 43/02* (2006.01)
- *B29C 43/00* (2006.01)
- *B29C 59/04* (2006.01)
- *B82Y 30/00* (2011.01)
- *B82Y 99/00* (2011.01)
- *B29C 33/40* (2006.01)

(52) U.S. Cl.
CPC .... *B29C 2043/023* (2013.01); *B29C 2043/025* (2013.01); *B29C 2059/023* (2013.01); *B82Y 30/00* (2013.01); *B82Y 99/00* (2013.01)

(56) References Cited

U.S. PATENT DOCUMENTS

| | | | |
|---|---|---|---|
| 2007/0243287 A1* | 10/2007 | Su | B29C 33/30 425/436 R |
| 2008/0145525 A1 | 6/2008 | Guo et al. | |
| 2008/0278949 A1* | 11/2008 | Kim | G02B 6/0053 362/257 |
| 2010/0270705 A1* | 10/2010 | Okushima | B82Y 10/00 264/293 |

FOREIGN PATENT DOCUMENTS

| | | | |
|---|---|---|---|
| JP | 2002105230 | * | 4/2002 |
| JP | 2004059822 | A | 2/2004 |
| JP | 2004306030 | A | 11/2004 |
| JP | 4154595 | B2 | 7/2008 |
| JP | 2008178984 | A | 8/2008 |
| JP | 2010005841 | A | 1/2010 |
| JP | 2010184485 | A | 8/2010 |

* cited by examiner (a)

(b)

○ SOLVENT SOLUBLE RESIN
* ADDITIVE (c)

(d)

(e)

(a)

(b)

RESIN MOLD, PRODUCTION METHOD THEREOF, AND USE THEREOF

TECHNICAL FIELD

The present invention relates to a resin mold. More specifically, the present invention relates to a resin mold having superior releasability from a resin to be imprinted.

BACKGROUND ART

Imprinting technology is a technology in which a mold for molding a depressions and protrusions pattern is pressed into a liquid resin or the like upon a substrate, and transfers the pattern of the mold to the resin. Depressions and protrusions patterns exist at sizes ranging from nano-scale (10 nm level) to about 100 µm, and these patterns are used in various types of fields such as semiconductor materials, optical materials, recording media, micro machines, biotechnology, environment, or the like.

Types of imprinting are exemplified by thermal imprinting, photo imprinting, or the like. Thermal imprinting presses a mold having a certain pattern formed in the surface thereof against a thermoplastic resin melted at a temperature greater than or equal to the glass transition temperature, thermally imprints the surface pattern of the mold into the thermoplastic resin, and peels off the imprinted thermoplastic resin from the mold after cooling. Photo imprinting presses the same type of mold against a photo-curable resin, causes curing of the photo-curable resin by ultraviolet radiation, and then peals the cured photo-curable resin from the mold.

In order to prevent attachment of the resin to the mold during imprinting, a release layer is arranged on the depressions and protrusions surface of the mold so as to impart releasability from the resin to the depressions and protrusions surface. However, there has been a problem in that, when the release layer adheres poorly to the mold, the release layer is shed due to imprinting. Therefore in order to solve the aforementioned problem, a method is known that treats the surface of the mold by plasma treatment or a silane coupling agent treatment so as to cause an improvement of adhesion of the mold release agent to the mold (e.g. see Patent Document 1). Moreover, a method is known that uses as the mold release agent a perfluoropolyether having functional groups that are chemically reactive with the material of the mold (e.g. see Patent Documents 2 and 3). These methods all relate to release treatment for molds of hard substances such as metal, silicon, glass, or the like.

Resin molds are being used in recent years due to general versatility and cost. Mold release agents are being used even for resin molds. However, since the resin mold and the resin to be imprinted are both resins, adhesion of the mold release agent is of a similar extent to both resins, and this results in a problem in that the release layer is transferred to the resin to be imprinted. Technology is desired for improving adhesion of the release layer to the resin mold.

In order to solve the aforementioned problems, for example, an oxide layer composed of an inorganic oxide is formed on the surface of a replica mold, and shedding of the release layer from the surface of the replica mold is prevented. Although it is possible to prevent shedding of the release layer from the oxide layer by formation of a release layer with this oxide layer interposed between the release layer and the mold, adhesion of this oxide film to the resin film is not necessarily good.

Therefore, there is a problem in that, even when the release layer and the oxide film are integrated, there still may be transfer of the integrated release layer and oxide film to the surface of the imprinted resin film.

Patent Document 1: Japanese Unexamined Patent Application Publication No. 2010-5841
Patent Document 2: Japanese Patent No. 4154595
Patent Document 3: Japanese Unexamined Patent Application Publication No. 2004-306030

SUMMARY OF INVENTION

Problem to be Solved by the Invention

An object of the present invention is to provide a resin mold for imprinting without transfer defects, that has excellent releasability from the resin to be imprinted, and that is free of shedding of the mold release agent when imprinting. Moreover, another object of the present invention is to provide a resin mold that is capable of inexpensive mass production. Yet another object of the present invention is to provide a resin mold that has flexibility and can be used by fixing to a roller or the like.

SUMMARY OF THE INVENTION

[1] A resin mold comprising:
a substrate,
a resin layer formed upon the substrate and having a depressions and protrusions pattern formed on the surface of the resin layer,
and a release layer containing a mold release agent and being formed with uniform thickness on at least the surface of the depressions and protrusions pattern of said resin layer;
wherein said resin layer comprises a solvent soluble resin and an additive; the additive contains a substituent group capable of coupling with said mold release agent and a substituent group having compatibility with said solvent soluble resin and has bleeding ability with respect to the solvent soluble resin;
said additive is localized in the vicinity of said resin layer surface and the substituent group capable of coupling with the mold release agent contained in the additive bonds chemically with said mold release agent to couple together said resin layer and release layer.

[2] The resin mold according to [1]; where the pure water contact angle of the aforementioned release layer surface is greater than or equal to 100 degrees.

[3] The resin mold according to [1] or [2]; where the aforementioned additive is a compound, or hydrolysate thereof, indicated by the below listed General Formula (1):

$$Y_{3-n}(CH_3)_n SiX \qquad (1)$$

In General Formula (1), Y is a methoxy or ethoxy group; X is an organic group including one type selected from the group consisting of an epoxy group, glycidoxy group, and optionally substituted phenyl group and amino group; and n is 0 or 1.

[4] The resin mold according to any one of [1] to [3]; where the content of the aforementioned additive within the aforementioned resin layer is from 1 to 13 percent by weight.

[5] The resin mold according to [3] or [4]; where the aforementioned solvent soluble resin has a constituent unit having a substituent group of the same type as X in the aforementioned General Formula (1).

[6] The resin mold according to [5]; where, in the aforementioned solvent soluble resin, the content of the constituent unit having the substituent group of the same type as X in the aforementioned General Formula (1) is from 1 to 15 percent by weight.

[7] The resin mold according to any one of [3] to [6]; where the aforementioned substituent group of the aforementioned additive having compatibility with the aforementioned solvent resin is the substituent group X in the aforementioned General Formula (1).

[8] The resin mold according to any one of [3] to [7]; where the aforementioned substituent group of the aforementioned additive capable of coupling with the aforementioned mold release agent is the substituent group Y in the aforementioned General Formula (1) or a hydrolysate of such substituent group Y.

[9] The resin mold according to any one of [1] to [8]; where the aforementioned mold release agent is at least one type selected from the group consisting of fluorine-based silane coupling agents, mono-terminal aminated perfluoro (perfluoroether) compounds, and mono-terminal carboxylated perfluoro (perfluoroether) compounds.

[10] The resin mold according to any one of [1] to [9]; where the aforementioned substrate is a resin substrate, glass substrate, silicon substrate, sapphire substrate, carbon substrate, or GaN substrate.

[11] The resin mold according to [10]; where the aforementioned resin substrate is one type of resin selected from the group consisting of: polyethylene terephthalates, polycarbonates, polymethylmethacrylates, polyimides, polysulfones, polyether sulfones, cyclic polyolefins, and polyethylene naphthalates.

[12] The resin mold according to any one of [1] to [11]; where period of the depressions and protrusions pattern of the surface is from 10 nm to 50 μm.

[13] The resin mold according to any one of [1] to [12]; where shape of the depressions and protrusions pattern of the surface is linear shaped, columnar shaped, moth-eye-pattern shaped, or lens shaped.

[14] A method of production of a resin mold comprising steps of:

(I) applying to a substrate a solution dissolving a solvent soluble resin and an additive in a solvent, and forming a resin solution layer on the substrate;

(II) removing the solvent from the aforementioned resin solution layer and forming a resin layer upon the substrate;

(III) contacting a mold against the aforementioned resin layer, and transferring a depressions and protrusions pattern formed in the surface of the aforementioned mold to the surface of the aforementioned resin layer; and (IV) coating a mold release agent on the surface of at least the depressions and protrusions pattern of the aforementioned resin layer, and forming a release layer of uniform thickness.

[15] A method of use of a resin mold comprising steps of: contacting the resin surface against the resin mold according to any one of [1] to [13]; and pealing the aforementioned resin mold from the aforementioned resin.

[16] The method of use of a resin mold according to [15]; where the aforementioned resin is a photo-curable resin.

[17] The resin mold according to any one of [1] to [13]; where the resin mold is fixed to a roller.

The resin mold of the present invention has excellent releasability from the resin to be imprinted, and there is no shedding of mold release agent due to imprinting. Moreover, the imprinted resin has no transfer defects.

The resin mold of the present invention is mainly composed of resin, and thus inexpensive mass production is possible, and the resin mold is flexible.

DETAILED DESCRIPTION OF THE INVENTION

The present invention will be explained concretely hereinafter.

The present invention will be explained with reference to the schematic cross-sectional view of the resin mold of the present invention shown in FIG. 1.

The present invention relates to a resin mold including: a substrate, a resin layer formed upon the substrate and having a depressions and protrusions pattern formed in the surface thereof, and a release layer including a mold release agent and being formed of uniform thickness on at least the depressions and protrusions pattern of the aforementioned resin layer;

where the aforementioned resin layer has a solvent soluble resin, and the aforementioned resin layer further includes an additive that has bleeding ability with respect to the solvent soluble resin, has a substituent group capable of coupling with the aforementioned mold release agent, and has a substituent group having compatibility with the aforementioned solvent soluble resin;

the aforementioned additive is localized in the vicinity of the aforementioned resin layer surface; and the group of the additive capable of coupling with the mold release agent bonds chemically with the aforementioned mold release agent and couples together the aforementioned resin layer and release layer.

1. Method for Production of the Resin Mold

This resin mold is produced by the steps of:

(I) applying to a substrate a solution dissolving a solvent soluble resin and an additive in a solvent, and forming a resin solution layer on the substrate;

(II) removing the solvent from the aforementioned resin solution layer and forming a resin layer upon the substrate;

(III) contacting a mold against the aforementioned resin layer, and transferring a depressions and protrusions pattern formed in the surface of the aforementioned mold to the surface of the aforementioned resin layer; and (IV) coating a mold release agent on the surface of at least the depressions and protrusions pattern of the aforementioned resin layer, and forming a release layer of uniform thickness.

The method of producing the quasi-4 layer structure resin mold will be described with reference to FIG. 2.

A substrate 4 is prepared as shown in FIG. 2(a).

Next, a resin solution is applied to the substrate 4 as shown in FIG. 2(b), and a resin solution layer 3' is produced.

Figure 2:
FIG. 2 shows the method of production of the resin mold of the present invention that has a quasi-4 layer structure.
Figure 2:
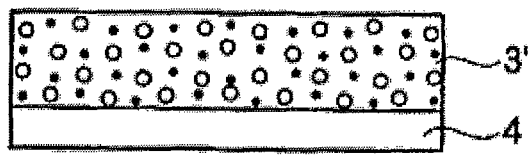
Figure 2:
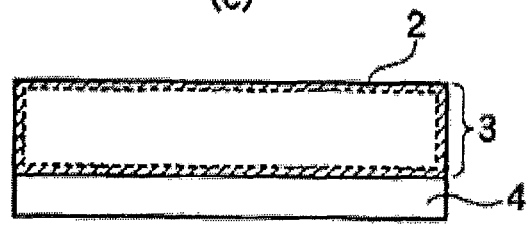
Figure 2:
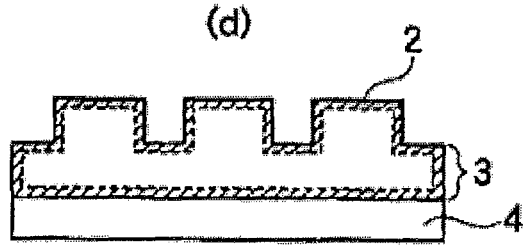
Figure 2:
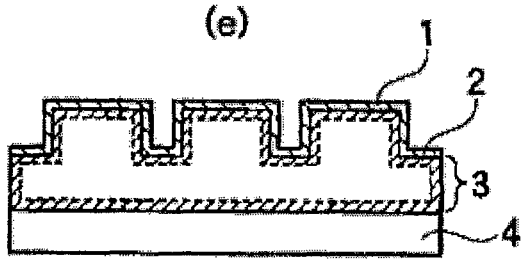

Next, the solvent is removed from the resin solution layer 3' as shown in FIG. 2(*c*), and a resin layer 3 is formed in which the additive 2 is localized in the vicinity of the surface above the substrate 4.

Next, by contacting the mold against the aforementioned resin layer 3 as shown in FIG. 2(*d*), the depressions and protrusions pattern formed in the surface of this mold is transferred to the surface of the resin layer.

Thereafter, as shown in FIG. 2(*e*), a release layer 1 of uniform thickness is formed on the surface of said resin layer 3 at least where the depressions and protrusions pattern is present.

<Step (I): Step of Coating the Solution Dissolving Solvent Soluble Resin and Additive in a Solvent on the Substrate, and Forming a Resin Solution Layer>

In step (I), firstly the solvent soluble resin and the additive are uniformly dissolved in solvent to produce the resin solution.

The solvent is a normal organic solvent, as exemplified by: aromatic type solvents such as benzene, toluene, xylene, or the like; ketone type solvents such as acetone, methyl ethyl ketone, cyclohexanone, or the like; halogen type solvents such as methylene chloride, chloroform, carbon tetrachloride, ethylene chloride, tetrachloroethane, chlorobenzene, or the like; ether type solvents such as tetrahydrofuran, dioxane, ethylene glycol diethyl ether, or the like; ester type solvents such as methyl acetate, ethyl acetate, ethyl cellosolve, propylene glycol methyl ester acetate, or the like; alcohol type solvents such as methanol, ethanol, isopropyl alcohol, or the like; as well as dimethylformamide, dimethyl sulfoxide, diethyl formamide, or the like. From the standpoint of coating ability, the solvent is preferably an aromatic type solvent or ester type solvent. Moreover, propylene glycol methyl ether acetate and toluene are particularly preferred solvents.

The additive which is possible to use, has a substituent group that is capable of coupling with the aforementioned mold release agent and has a substituent group that is compatible with the aforementioned solvent soluble resin and has bleeding ability with respect to the solvent soluble resin.

Examples of the additive include the compounds indicated by the below listed General Formula (1) and hydrolysates of such compounds.

$$Y_{3-n}(CH_3)_n SiX \qquad (1)$$

In General Formula (1), Y is a methoxy or ethoxy group; X is an organic group including one type selected from the group including an epoxy group, glycidoxy group, and optionally substituted phenyl group or amino group; and n is 0 or 1.

The organic group preferably has 1 to 9 carbon atoms, more preferably has 2 to 6 carbon atoms, and yet further preferably has 3 to 6 carbon atoms.

Here, the Y group or the hydrolysate thereof is considered to be the group that has the ability to couple with the aforementioned mold release agent. X is considered to be the group that has compatibility with the aforementioned solvent soluble resin.

Any resin may be used as the solvent soluble resin as long as resin that is soluble in the aforementioned solvent and there is no separation from the aforementioned additive. Examples of thermoplastic resins include acrylic type resins, methacrylic type resins, styrene type resins, epoxy type resins, polyester type resins, olefin type resins, polycarbonate type resins, and the like. When the additive is a compound as indicated in the aforementioned General Formula (1), from the standpoint of compatibility with the additive, the solvent soluble resin is preferably the above mentioned thermoplastic resin that has a constituent unit that includes the same type of substituent group as X. The constituent unit having the same type of substituent group as X is included (based on total constituent units of the resin) at a concentration that is preferably from 1 to 15 percent by weight, and more preferably from 2 to 10 percent by weight. When the aforementioned range is used, although there is no separation of the solvent soluble resin and the additive, both components are not entirely miscible after removal of the solvent, and it is thought that the additive bleeds out toward the resin layer surface.

When the solvent soluble resin and additive are added to the aforementioned solvent, both components dissolve uniformly. Taking the total parts by weight of the solvent soluble resin and the additive to be 100 parts by weight, the added portion of the solvent soluble resin in the solvent is preferably from 87 to 99 parts by weight, and more preferably from 91 to 98 parts by weight, and the added portion of the additive in the solvent is preferably from 1 to 13 parts by weight, and more preferably is from 2 to 9 parts by weight. The total added amount of the solvent soluble resin and additive in the solvent relative to the solvent is preferably 5 to 50% by weight, and more preferably is 10 to 40% by weight.

Thereafter, the solution containing the aforementioned solvent soluble resin and additive dissolved in solvent is coated onto the substrate, and the resin solution layer is formed.

Examples of the substrate include one type selected from among resin substrates, glass substrates, silicon substrates, sapphire substrates, carbon substrates, and GaN substrates. For forming a flexible resin mold, the resin substrate is preferable, the substrate is exemplified by one type selected from the group including polyethylene terephthalate, polycarbonates, polymethylmethacrylates, polyimides, polysulfones, polyether sulfones, cyclic polyolefins, and polyethylene naphthalates.

Examples of a coating method of the solution on the substrate include spin coating, spray coating, bar coating, lip coating, slit coating, or the like.

<(Step II): Step of Removing the Solvent from the Aforementioned Resin Solution Layer and Forming the Resin Layer Upon the Substrate>

Thereafter, the solvent is removed from the resin solution layer, and a resin layer is formed. The resin layer comprises the solvent soluble resin, and the additive which has a substituent group capable of coupling with the aforementioned mold release agent, has a substituent group having compatibility with the aforementioned solvent soluble resin, and has bleeding ability relative to the solvent soluble resin.

Examples of a removal method of the solvent include placing the resin solution layer on a hot plate or the like to cause drying. The temperature of drying is normally a temperature greater than or equal to the boiling point of the solvent, and this temperature is a temperature that does not affect properties of the resin or the like.

A thickness of the resin layer formed in this manner is normally from 50 nm to 30 µm, and preferably is from 500 nm to 10 µm. Such a thickness facilitates imprinting processing.

Compatibility between the additive and solvent soluble resin is thought to change due to this drying step. Except for the substituent group having compatibility with the solvent soluble resin, the additive is thought to not have good overall compatibility with the solvent soluble resin. As a result, when solvent is removed from the resin solution layer, only the substituent group having compatibility with the solvent soluble resin is thought to remain within the resin layer, and the remaining constituent part of the additive is thought to protrude outside the resin layer, resulting in bleeding at the surface of the resin layer so that the additive becomes localized in the vicinity of the resin layer surface.

Thus, if the additive is the compound indicated by the aforementioned General Formula (1), due to the solvent soluble resin having a constituent unit having a substituent group that is the same type as the substituent group X, the additive has partial compatibility with the solvent soluble resin, and it is thought that a structure does not result where the additive and the solvent soluble resin are separated. Since the non-X part of the additive does not have compatibility with the solvent soluble resin, the additive is thought to localize near the surface of the resin layer, resulting in bleeding out occurs. In this context, the expression "a substituent group that is the same type as the substituent group X" means a substituent group that has the same basic skeleton. For example, if X is the glycidoxy group, this means the substituent group having an epoxy structure. If X is an optionally substituted phenyl group, this means the substituent group having an aromatic ring.

Taking the total percent by weight of the solvent soluble resin and additive to be 100 percent by weight, the resin layer comprises the solvent soluble resin is preferably from 87 to 99 percent by weight, and more preferably from 91 to 98 percent by weight of the resin layer. The resin layer comprises the additive is preferably from 1 to 13 percent by weight, and more preferably from 2 to 9 percent by weight, of the resin layer. When the proportions of the solvent soluble resin and additive are within the aforementioned range, the resin layer and release layer are bonded together with sufficient adhesiveness, and there is no shedding of the additive from the resin layer.

<(Step III): Step of Contacting the Mold Against the Aforementioned Resin Layer, and Transferring the Depressions and Protrusions Pattern Formed in the Surface of the Mold to the Surface of the Aforementioned Resin Layer>

The surface geometry (i.e. depressions and protrusions pattern) of the mold (i.e. quartz, metal, silicon, or the like normally used for imprinting) is copied (imprinted) to the surface of the aforementioned resin layer.

Although no particular limitation is placed on the surface geometry (depressions and protrusions pattern) of the mold, the surface geometry preferably has a period of 10 nm to 50 µm, a depth of 10 nm to 100 µm, and a transferring surface of 1.0 to $1.0 \times 10^6$ mm$^2$. More preferably, the surface geometry has a period of 20 nm to 20 µm, a depth of 50 nm to 1 µm, and a transferring surface of 1.0 to $0.25 \times 10^6$ mm$^2$. Due to such surface geometry, it is possible to form a sufficient depressions and protrusions pattern in the resin layer. Examples of geometry include moth-eye pattern, linear, columnar, monolithic, conical, multi-sided pyramidal, and micro-lens shaped.

The transferring (imprinting) is performed by thermal imprinting since the aforementioned resin layer is a thermoplastic resin.

For the thermal imprinting to be performed using the operation normally used for thermal imprinting of a thermal plastic resin, a preferred thermal imprinting operation that may be cited is performed by maintaining the mold at a pressure of 0.5 to 50 MPa for 10 to 600 seconds against a resin heated to a temperature greater than or equal to the glass transition temperature (Tg), thereafter cooling the resin to a temperature less than or equal to the glass transition temperature (Tg), and then pulling apart the mold and resin layer. The depressions and protrusions pattern is formed in the surface of the resin layer by the thermal imprinting.

<(Step IV): Step of Coating a Mold Release Agent at Least on the Surface where the Aforementioned Resin Layer has the Depressions and Protrusions Pattern, and Forming a Release Layer of Uniform Thickness>

On at least the surface having the pattern of the aforementioned resin layer, the release layer is formed by coating the aforementioned mold release agent by a normal coating operation such as dip coating, spin coating, vapor deposition, spraying, or the like. Furthermore, the mold release agent may be a mold release agent diluted by an organic solvent in which the mold release agent dissolves.

The mold release agent is preferably at least one type selected from the group including fluorine-based silane coupling agents, perfluoro compounds having an amino group or carboxyl group, and perfluoro ether compounds having an amino group or carboxyl group. More preferably, the mold release agent is at least one type selected from the group including fluorine-based silane coupling agents, mono-terminal aminated perfluoro (perfluoroether) compounds, and mono-terminal carboxylated perfluoro (perfluoroether) compounds, either as a single compound or a mixture of single compound and multiple compounds.

When the aforementioned type of compound is used as the mold release agent, adhesion to the above mentioned resin layer is excellent, and releasability from the imprinted resin is excellent.

After the aforementioned coating operation, rinse treatment of the surface of the mold release agent coating film is preferably performed using, for example, fluorine-based solvent such as perfluorohexane. Although the aforementioned rinse treatment is preferable in order to obtain a release layer of uniform thickness, it is permissible not to perform rinse treatment if it is possible to maintain uniform thickness of the release layer by the aforementioned mold release agent coating operation.

Due to this process, a release layer is formed that preferably has a thickness of 0.5 to 20 nm, more preferably 0.5 to 10 nm, and most preferably 0.5 to 5 nm.

The release layer is thought to bind to the aforementioned resin layer by chemical bonding between the mold release agent and the group capable of coupling with the mold release agent of the additive mainly present near the resin layer surface. The chemical bonding is thought to be due to condensation reaction.

When the aforementioned additive is indicated by the aforementioned General Formula (1), the substituent group Y (or hydrolysate thereof) is thought to chemically bonded with a substituent group (including groups generated by hydrolysis) of the mold release agent. The chemical bonding is thought to be due to condensation reaction.

The aforementioned release layer is formed at uniform thickness on at least the surface that has the depressions and protrusions pattern of the resin layer. The expression "uniform thickness" means substantially uniform thickness, and means a thickness that is uniform within a standard deviation of 0.1 to 10. Therefore, the surface of the release layer maintains the depressions and protrusions shape of the resin layer surface geometry.

The release layer contact angle for pure water on the release layer surface is preferably at least 100 degrees, more preferably is from 100 to 130 degrees, and further preferably is from 100 to 120 degrees.

Wetting ability is low when the contact angle is within the aforementioned range, and it is thus possible to suppress flow of the resin of the release layer surface during coating of the liquid imprinting resin on the surface of the release layer. It is also thought that the imprinted resin becomes readily pealed from the release layer surface.

2. Resin Mold

The resin mold of the present invention is produced by the aforementioned production method.

The invention of the present application is a resin mold that has a multi-layer structure.

Figure 1:
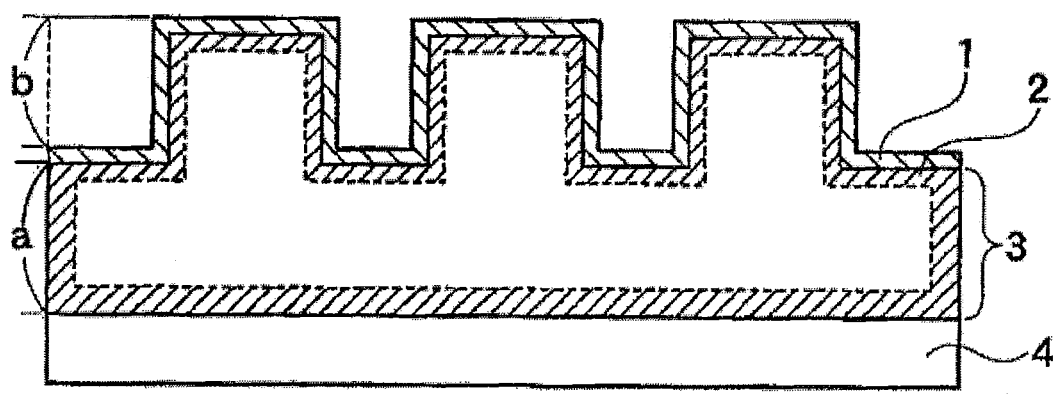
FIG. 1 shows a resin mold of the present invention that has a quasi-4 layer structure.

As shown in FIG. 1, the resin mold of the present invention is a quasi-4 layer structure resin mold that has a substrate 4, a resin layer 3 formed upon the aforementioned substrate and having a depressions and protrusions pattern, the aforementioned additive 2 mainly present near the resin layer surface, and a release layer 1 formed of uniform thickness at least on the surface of said resin layer 3 having the depressions and protrusions pattern.

The resin layer of the resin mold of the present invention is the resin layer formed by steps (I) to (III) of the aforementioned production method. Therefore, the solvent soluble resin and additive composing the resin layer, the dimensions of the resin layer, and the structure of the resin layer are as explained above. The height "a" of the resin layer shown in FIG. 1 (i.e. the height of the part lacking depressions and protrusions shape) is preferably from 1 to 15 times height of "b" shown in FIG. 1 (i.e. height of the depressions and protrusions shape). Imprint processing may be performed without problem when this ratio is used.

The release layer of the resin mold of the present invention is the release layer formed by the step (IV) of the aforementioned production method. Therefore, the mold release agent composing the release layer and dimensions of the release layer are as described above.

The aforementioned resin layer and the aforementioned release layer are thought to be bonded together by chemical bonding between the aforementioned additive and mold release agent. The mechanism thereof is as described above.

The aforementioned resin mold has the desired geometry on the surface.

The "desired geometry" is normally a depressions and protrusions pattern that has a fixed repeat frequency. That is to say, this is a depressions and protrusions pattern that preferably has a frequency of 10 nm to 50 μm, a depth of 10 nm to 100 μm, and a transferring surface of 1.0 to 1.0×10$^6$ mm$^2$.

Specific examples of geometries include moth-eye, linear, columnar, monolithic, conical, multi-sided pyramidal, and micro-lens shaped.

In other words, the resin mold of the present invention has a resin layer having a depressions and protrusions pattern structure on the surface, and has a release layer including a mold release agent formed of a uniform thickness on at least the surface having a depressions and protrusions pattern structure of the aforementioned resin layer.

The above mentioned resin layer includes an additive (i.e. the compound indicated by the below listed General Formula (1) or a hydrolysate thereof)

$$Y_{3-n}(CH_3)_n SiX \qquad (1)$$

(within the General Formula (1), Y is a methoxy or ethoxy group; X is an organic group including one type selected from the group including an epoxy group, glycidoxy group, and optionally substituted phenyl group or amino group; and n is 0 or 1)

and a solvent soluble resin having a substituent group that is the same type as the substituent group X in the aforementioned General Formula (1).

The resin mold is characterized in that the aforementioned resin layer and release layer are bonded together due to chemical bonding between the mold release agent and the substituent group Y of the aforementioned additive or hydrolysate group thereof.

A roller type resin mold is cited as one aspect of the resin mold of the present invention.

Figure 4:
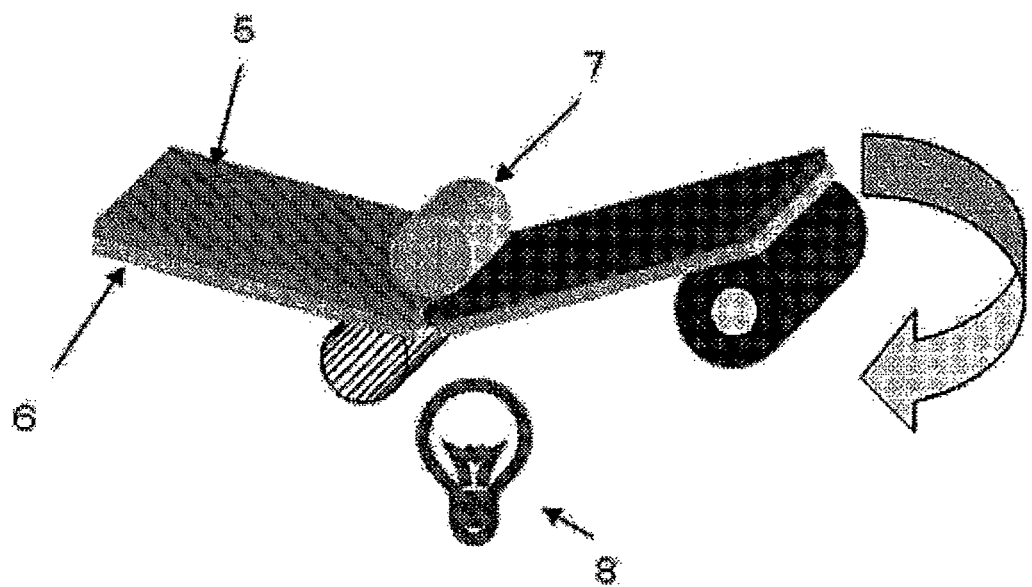
FIG. 4 shows the method of use of the roller type resin mold.

As shown in FIG. 4, a roller type resin mold is a mold of a configuration similar to the aforementioned resin mold where the mold in a form wound upon a roller or the like with the depressions and protrusions surface is oriented outwardly.

In a preferred configuration of the roller type resin mold, the mold has a flexible structure of 30 to 300 μm thickness.

3. Method of Use of the Resin Mold (1) Normal Method of Use

Figure 3:
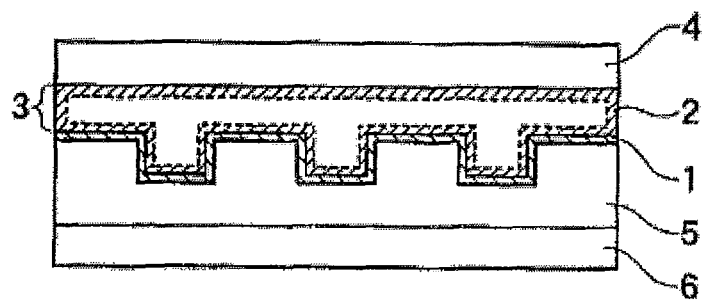
FIG. 3 shows the method of use of the resin mold of the present invention.
Figure 3:
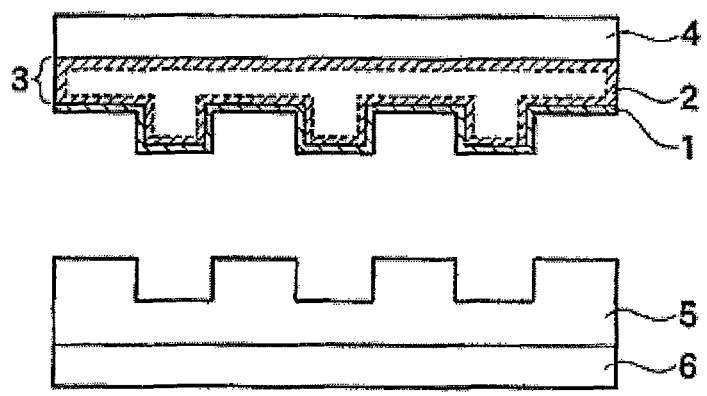

The resin mold of the present invention is used with advantage for imprinting a thermoplastic resin, thermosetting resin, or photo-curable resin. More preferably the resin mold of the present invention is used with advantage for imprinting a photo-curable resin. An embodiment of the method of use will be described using FIG. 3.

Next, as shown in FIG. 3(a), the resin mold of the present invention is contacted against the resin 5 surface.

Next, as shown in FIG. 3(b), the resin mold of the present invention is peeled away, and the resin 5 is obtained with a patterned surface.

<Step of Contacting the Resin Mold Against the Resin Surface>

The resin 5 to be imprinted is normally a thermoplastic resin, thermosetting resin, or photo-curable resin, and the resin 5 to be imprinted is normally on a substrate 6.

Any substrate may be used without limitation as the substrate 6 provided that it is a substrate normally used for imprinting, as exemplified by resins, glasses, silicon, sapphire, gallium nitride, carbon, silicon carbide, or the like.

If a thermoplastic resin or thermosetting resin is used, it is possible to use the procedure used for normal thermal imprinting thermoplastic resin or thermosetting resin. However, processing is preferably performed by pressing the mold at a pressure of 0.5 to 50 MPa for a time of 10 to 600 seconds against the resin heated to a temperature greater than or equal to the glass transition temperature (Tg).

Any generally used thermoplastic resin or thermosetting resin may be used without limitation as the thermoplastic resin or thermosetting resin.

If a photo-curable resin is used, it is possible to use the operation normally used for photo imprinting of a photo-curable resin. However, the procedure is preferably performed, while maintaining contact of the mold against the resin at a pressure of 0.1 to 5 MPa for 1 to 600 seconds, by irradiation using energetic radiation (i.e. ultraviolet radiation, visible radiation, infrared radiation, or electron beam radiation).

In photo imprinting of the photo-curable resin, since greater pressure is not required than that for thermal imprinting in the above described manner, it is possible to appropriately use various types of embodiments of the resin mold of the present invention. For example, a flexible embodiment of the resin mold or the like using a film or the like on the substrate may be used with advantage for photo imprinting of the photo-curable resin.

Any general photo-curable resin may be used as the photo-curable resin without limitation.

<Step of Separating the Resin and Resin Mold>

When a thermoplastic resin or thermosetting resin is used, the resin is cooled to a temperature less than or equal to the glass transition temperature (Tg), and the resin layer and the mold are separated.

When a photo-curable resin is used, the mold and resin layer are separated.

(2) Method of Use as a Roller Type Resin Mold

The resin mold of the present invention may be used as a roller type resin mold by wrapping the resin mold upon a roller or the like.

Use of the resin mold as a roller type resin mold is suitable for imprinting a photo-curable resin. As shown in FIG. 4, the aforementioned step of pressing the resin mold against the aforementioned resin surface is composed of pressing the resin mold wrapped upon a roller against the aforementioned resin surface and irradiating by ultraviolet radiation.

4. Applications

The resin mold of the present invention is used for imprinting a thermoplastic resin, thermosetting resin, or photo-curable resin.

The various products obtained from the imprinted resin may be used for semiconductor materials, optical elements, prisms, micro lenses, memory media, holography, micro-machines, biotech products, environmental products, and electronic materials such as semiconductors, LEDs, hard discs, or the like.

A surface pattern geometry period of 20 nm to 500 nm is preferred for use in semiconductor materials, media, optical elements, or the like. A surface pattern geometry period of 200 nm to 20 μm is suitable for use in prisms, micro lenses, or the like.

If the resin mold of the present invention is a roller type resin mold, the resin mold may be used for continuous molding, and such a roller type resin mold is preferably used for optically functional films such as a micro lens film, anti-reflective film, or the like.

EXAMPLES

Although the present invention is explained below further based on examples, the present invention is not limited by these examples.

In the specification of the present application and in the examples, various values were measured by the below described measurement methods.

<Weight Average Molecular Weight Mw>

Gel permeation chromatography (GPC) was used to determine weight average molecular weight (Mw) based on standard polystyrene.
Measurement Conditions
Equipment: HLC-8120 GPC (manufactured by Tosoh Corp.)
Column: The 5 columns listed below were used in series.
TSK-GEL HXL-H (guard column, manufactured by Tosoh Corp.)
TSK-GEL G7000 HXL (manufactured by Tosoh Corp.)
TSK-GEL GMHXL (manufactured by Tosoh Corp.)
TSK-GEL GMHXL (manufactured by Tosoh Corp.)
TSK-GEL G2500 HXL (manufactured by Tosoh Corp.)
Sample concentration: diluted by tetrahydrofuran to reach a concentration of 1.0 mg/cm$^3$
Mobile phase solvent: tetrahydrofuran
Flow rate: 1.0 cm$^3$/minute
Column temperature: 40° C.

<Thickness of the Resin Layer>

Thickness of the resin layer was taken to be the separation between the resin layer bottom surface and the highest surface within the surface having the depressions and protrusions pattern.

<Thickness of the Release Layer>

A thickness measurement device (model F20, manufactured by Filmetrics Inc.) was used. Measurement was performed at 5 arbitrary locations within the surface, and the average value was taken to be thickness of the release layer. Uniformity of thickness was checked by the standard deviation of the aforementioned 5 points.

<Contact Angle of Pure Water Against the Release Layer Surface>

The contact angle is measured in air by placing a minute water droplet of about 1 μL volume was placed on the sample surface with a Kyowa Contact-Angle Meter model CA-D, manufactured by Kyowa Interface Science Co., Ltd. Measurement conditions were based on JIS R3257.

The rate of change was found by the following formula: ("pre-imprint release layer contact angle"–"post-imprint release layer contact angle")÷"pre-imprint release layer contact angle"×100 (percent).

<Surface Geometry (Pattern)>

The period and line width were evaluated by SEM (S-4800, manufactured by Hitachi High Technologies Corp.), and depth (height) was evaluated using an AFM (L-Trace, manufactured by SII NanoTechnology, Inc.).

<Imprinting Results>

Macro-evaluation: The transferring surface formed on the imprinted resin was observed at ×20 magnification using an optical microscope (ELIPSE LV100, manufactured by Nikon Corp.), and the presence or absence of resin attachment to the mold was checked.

◯: There was no resin attachment. x: There was resin attachment.

SEM (period): The pattern formed in the imprinted resin was measured by SEM, and the evaluation was performed by determining whether or not there was a change in the SEM measurement results for the pattern formed in the resin mold surface according to the below listed standards.

◯: The amount of change was less than 10 nm. x: The amount of change was greater than or equal to 10 nm.

AFM (depth): The pattern formed in the imprinted resin was measured by AFM. The presence or absence of change based on the AFM measurement results for the pattern formed in the surface of the resin mold was determined and evaluated according to the below listed standards.

◯: The amount of change was less than 10 nm. x: The amount of change was greater than or equal to 10 nm.

Example 1

(i) Preparation of Resin (PMMA Type) for the Resin Mold 95 parts by weight of methyl methacrylate (product name=LIGHT ESTER M, manufactured by Kyoeisha Chemical Co., Ltd.), 5 parts by weight of glycidyl methacrylate (product name=LIGHT ESTER G, manufactured by Kyoeisha Chemical Co., Ltd.), and 100 parts by weight of toluene were added to a flask equipped with a stirrer device, nitrogen gas feed tube, thermometer, and tubular refluxing condenser. Thereafter, while nitrogen gas was fed into the flask, the contents of the flask were heated to 80° C., 0.5 parts by weight of dimethyl 2,2'-azobis(2-methylpropionate) (product name=V-601, manufactured by Wako Pure Chemical Industries, Ltd.) as the initiator was added, and temperature was maintained at 80° C. for 8 hours. Thereafter, the flow of nitrogen gas was stopped, 100 parts by weight of toluene was added, and the reaction was stopped by lowering temperature to obtain the resin for the resin mold. Molecular weight of the obtained resin is shown in Table 1.

(ii) Production of the Resin Mold (ii-a) Production of the Resin Solution Layer and Resin Layer The resin for the resin mold produced in (1) was diluted 10-fold using toluene, and then 5 parts by weight of 3-glycidoxyproplytrimethoxysilane (product name=KBM-403, manufactured by Shin-Etsu Chemical Co., Ltd.) was added per 100 parts by weight of resin. Thereafter, this resin solution was spin coated (2,000 rpm for 20 seconds) onto a polyethylene terephthalate film (PET) (product name=LUMIRROR; manufactured by Toray Industries, Inc.; 0.125 mm thick), and a hotplate was used for drying for 15 minutes at 130° C. A resin layer of 1.2 μm film thickness was produced.

(ii-b) Forming the Depressions and Protrusions Pattern of the Resin Layer Surface The laminate of the aforementioned film substrate and resin layer was heated to 140° C., and a master mold (i.e. quartz mold treated using release agent, transferring surface: 576 mm², 150 nm L/S (linear geometry), 300 nm period, 150 nm depth) (geometry I) was pressed against the resin layer surface, and thermal imprinting was performed at 140° C. The pressure of 20 MPa during thermal imprinting was maintained for 5 minutes. Thereafter, the laminate was cooled down to 80° C. or less, the master mold was removed, and the resin mold was obtained (transferring surface of 576 mm², 150 nm L/S, 300 nm period, 150 nm depth). The period and line width were evaluated using SEM (S-4800, manufactured by Hitachi High Technologies Corp.). Depth (height) was evaluated by AFM (L-trace, manufactured by SII Nanotechnology, Inc.).

(ii-c) Production of the Release Layer

After the resin mold obtained during step (ii-b) was dipped for 1 minutes in a perfluoro polyether type mold release agent solution (product name=OPTOOL HD-1100, manufactured by Daikin Industries, Ltd.), the resin mold was pulled up and placed for 1 hour in a warm and humid environment at 70° C. and 90% relative humidity. Thereafter, the resin mold was rinsed using a fluorine-based solvent (product name=OPTOOLHD-TH, manufactured by Daikin Industries, Ltd.), and the resin mold was left for 24 hours in a 23° C. and 65% relative humidity environment. The pure water contact angle was measured (Kyowa Contact-Angle Meter model CA-D, manufactured by Kyowa Interface Science Co., Ltd.) as 110° C. There were no defects or changes of geometry in the patterned part (150 nm line width, 300 nm period, 150 nm depth).

Measurement of contact angle for pure water was performed in the air by placement of a minute droplet (about 1 μL) on the sample surface.

(iii) Photo-Nanoimprinting Using the Resin Mold 0.2 mL of a photo-curing resin (product name=PAK-02, manufactured by Toyo Gosei Co., Ltd.) was dropped onto the resin mold obtained during step (ii-c), the droplet was covered by a polycarbonate film (product name=Lexan, manufactured by Asahi Glass Co., Ltd.), and a photo-nano imprinter device (manufactured by Engineering System Co., Ltd.) was used to perform imprinting by pressing at 1.0 MPa and simultaneously irradiating ultraviolet radiation (10 mW/cm²) for 2 seconds. Thereafter, the molded article was removed from the resin mold, and it was confirmed that there were no transfer defects in the molded article. Contact angle was measured by the same method as that of step (ii-c). It was confirmed that there was no change in contact angle. Furthermore, changes of geometry in the resin after imprinting was checked by SEM and AFM (148 nm line width, 298 nm period, 148 nm depth).

This resin mold was used to perform 20 consecutive photo-nanoimprintings. It was possible to imprint without problems.

Nanoimprinting results and the obtained resin mold for nanoimprinting are indicated in Table 1.

Example 2

Except for setting the added amount of 3-glycidoxypropyltrimethoxysilane in step (ii-a) of Example 1 to 10 parts by weight, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 1.

Example 3

Except for setting the added amount of 3-glycidoxypropyltrimethoxysilane in step (ii-a) of Example 1 to 1 part by weight, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 1.

Example 4

Except for use of 90 parts by weight of methyl methacrylate and the use of 10 parts by weight of glycidyl methacrylate in step (i) of Example 1, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 1.

Example 5

Except for use of 99 parts by weight methyl methacrylate and 1 part by weight of glycidyl methacrylate in step (i) of Example 1, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 1.

Example 6

Except for use of 95 parts by weight of styrene (product name=Styrene Monomer, manufactured by Idemitsu Kosan Co., Ltd.) in place of the methyl methacrylate of step (i) of Example 1, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 1.

Example 7

Except for use of 95 parts by weight of isobornyl methacrylate (product name=Light Ester 1B-X, manufactured by Kyoeisha Chemical Co., Ltd.) in place of the methyl methacrylate of step (i) of Example 1, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 1.

Example 8

Except for use of 3-glycidoxypropylmethyldimethoxysilane (product name=Z-6044, manufactured by Dow Corning Toray Co., Ltd.) rather than the 3-glycidoxypropyltrimethoxysilane of step (ii-a) of Example 1, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 2.

Example 9

Except for use of 5 parts by weight of benzyl methacrylate (product name=Light Ester BZ, manufactured by Kyoeisha Chemical Co., Ltd.) in place of the glycidyl methacrylate of step (i) of Example 1, and except for use of 5 parts by weight of phenyltrimethoxysilane (product name=KBM-103, manufactured by Shin-Etsu Silicone Co., Ltd.) in place of the 3-glycidoxypropyltrimethoxysilane of step (ii)-a of Example 1, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 2.

Example 10

Except for use of 5 parts by weight of dimethylaminoethyl methacrylate (product name=Light Ester DM, manufactured by Kyoeisha Chemical Co., Ltd.) in place of the glycidyl methacrylate of step (i) of Example 1, and except for use of 5 parts by weight of 3-aminoproplytrimethoxysilane (product name=KBM-903, manufactured by Shin-Etsu Silicone Co., Ltd.) in place of the 3-glycidoxypropyltrimethoxysilane of step (ii)-a of Example 1, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 2.

Example 11

Except for use of perfluoro hexanoic acid rather than the perfluoro polyether type mold release agent of step (ii-c) of Example 1, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 1.

Example 12

Except for use of 1H,1H-tridecafluoroheptylamine rather than the perfluoro polyether type mold release agent of step (ii-c) of Example 1, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 1.

Example 13

Except for change of the master mold used in step (ii-b) of Example 1 to a master mold (geometry II) with 576 mm$^2$ transferring surface, 25 nm L/S, 50 nm period, and 150 nm depth (linear pattern), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 3.

Example 14

Except for change of the master mold used in step (ii-b) of Example 1 to a master mold (geometry III) with 576 mm$^2$ transferring surface, 75 nm L/S, 150 nm period, and 150 nm depth (linear pattern), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 3.

Example 15

Except for change of the master mold used in step (ii-b) of Example 1 to a master mold (geometry IV) with 576 mm$^2$ transferring surface, 10,000 nm L/S, 20,000 nm period, and 300 nm depth (linear pattern), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 3.

Example 16

Except for change of the master mold used in step (ii-b) of Example 1 to a master mold (geometry V) with 576 mm$^2$ transferring surface, 200 nm hole diameter, 400 nm period, and 200 nm depth (columnar geometry), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 3.

Example 17

Except for change of the master mold used in step (ii-b) of Example 1 to a master mold (geometry VI) with 576 mm$^2$ transferring surface, 300 nm period, and 300 nm depth (moth-eye geometry), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 3.

Example 18

Except for change of the resin layer thickness of step (ii-a) of Example 1 to 6.4 µm, and except for change of the master mold used in step (ii-b) of Example 1 to a master mold (geometry VII) with 576 mm² transferring surface, 10,000 nm hole diameter, 20,000 nm period, and 4,000 nm depth (micro lens geometry), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 3.

Example 19

Except for change of the polyethylene terephthalate film substrate of step (ii-a) of Example 1 to a soda glass substrate (1.1 mm thickness, manufactured by Asahi Glass Corp.), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 4.

Example 20

Except for change of the polyethylene terephthalate film substrate of step (ii-a) of Example 1 to a silicon wafer substrate (0.5 mm thickness, manufactured by Covalent Materials Corp., usage grade=polished wafer grade), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 4.

Example 21

Except for change of the polyethylene terephthalate film substrate of step (ii-a) of Example 1 to a sapphire substrate (0.5 mm thickness, manufactured by Orbe Pioneer, Ltd., semiconductor grade), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 4.

Example 22

Except for change of the polyethylene terephthalate film substrate of step (ii-a) of Example 1 to a polysulfone substrate (0.12 mm thickness, product name=SUMILITE© FS-1200, manufactured by Sumitomo Bakelite Co., Ltd.), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 4.

Example 23

Except for change of the polyethylene terephthalate film substrate of step (ii-a) of Example 1 to a polycarbonate substrate (0.12 mm thickness, product name=Lexan, Asahi Glass Corp.), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 4.

Example 24

Except for change of the polyethylene terephthalate film substrate of step (ii-a) of Example 1 to a polyethylene naphthalate substrate (0.12 mm thickness, product name=TEONEX, manufactured by Teijin Chemicals, Ltd.), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 4.

Example 25

Except for change of the polyethylene terephthalate film substrate of step (ii-a) of Example 1 to a polyimide substrate (0.3 mm thickness, product name=AURUM Film, manufactured by Mitsui Chemicals, a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 4.

Example 26

Except for change of the polyethylene terephthalate film substrate of step (ii-a) of Example 1 to a polymethylmethacrylate substrate (0.12 mm thickness, product name=ACRYPLEN, manufactured by Mitsubishi Rayon Co., Ltd.), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 4.

Example 27

Except for change of the polyethylene terephthalate film substrate of step (ii-a) of Example 1 to diamond-like carbon surface-coated polyethylene terephthalate film substrate (0.12 mm thickness (1 µm coating layer), product name=Geniuscoat DLC, manufactured by Nippon-ITF Inc.), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 4.

Example 28

Except for change of the polyethylene terephthalate film substrate of step (ii-a) of Example 1 to glassy carbon (1 mm thickness, product name=SA-1, manufactured by Tokai Carbon Co., Ltd.), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 4.

Example 29

Except for change of the polyethylene terephthalate film substrate of step (ii-a) of Example 1 to a silicon carbide wafer (0.43 mm thickness, grade=6NH-Type, manufactured by Tanke Blue Semiconductor Co., Ltd.), a resin mold was produced in the same manner as Example 1. The obtained resin mold was used to perform photo-nanoimprinting in the same manner as that of Example 1.

Nanoimprinting results and the obtained resin mold for nanoimprinting are indicated in Table 4.

Comparative Example 1

When there was a change of the added amount of 3-glycidoxypropyltrimethoxysilane to 20 parts by weight during step (ii-a) of Example 1, the 3-glycidoxypropyltrimethoxysilane attached to the master mold during thermal nanoimprinting to the resin layer of step (ii-b), and it was not possible to obtain a resin mold.

The results are shown in Table 1.

Comparative Example 2

When the amount of added 3-glycidoxypropyltrimethoxysilane was changed to 0.5 parts by weight for step (ii-a) of Example 1, and when the pealing treatment of step (ii-c) was carried out, the release layer was shed during the rinse step. It is thought that this occurred since the required adhesivity between the resin layer and release layer was not ensured.

The results are shown in Table 1.

Comparative Example 3

When the amount of the methyl methacrylate was changed to 80 parts by weight and the amount of glycidyl methacrylate was changed to 20 parts by weight for step (i) of Example 1, there was no bleeding out of additive to the surface of the resin layer formed in step (ii-a). Then during the rinse process of pealing treatment of step (ii-c), there was shedding of the mold release agent from the resin surface, and it was not possible to form a release layer. It is thought that this shedding occurred due to increased compatibility between the resin and additive.

The results are shown in Table 1.

Comparative Example 4

When the amount of methyl methacrylate was changed to 99.5 parts by weight and the amount of glycidyl methacrylate was changed to 0.5 parts by weight for step (i) of Example 1, during the rinse process of pealing treatment of step (ii-c), there was shedding of the mold release layer from the resin surface. It is thought that this occurred since the required adhesivity between the resin layer and release layer was not ensured.

The results are shown in Table 1.

Comparative Example 5

When 5 parts of benzyl methacrylate (product name=Light Ester BZ, manufactured by Kyoeisha Chemical Co., Ltd.) was used instead of the glycidyl methacrylate in step (i) of Example 1, during the rinse process of pealing treatment of step (ii-c), there was shedding of the release layer. It is thought that this occurred since the required adhesivity between the resin layer and release layer was not ensured.

The results are shown in Table 2.

Reference Example 1

A polymer produced by the same method as that of step (i) of Example 1 was spin coated beforehand onto a glass substrate. The resin laminate was heated to 130° C., and an imprinting sheet was produced. Thermal imprinting was performed at 80° C. by pressing the resin mold produced during Example 1 (576 mm$^2$ transferring surface, 150 nm L/S, 300 nm period, 150 nm depth) against this imprinting sheet. The pressure of 20 MPa was maintained for 5 minutes during thermal imprinting. Thereafter, the laminate was cooled to a temperature less than or equal to the Tg of the resin composing the resin layer, the resin mold was removed, and it was confirmed that there were no transfer defects. The results are shown in Table 5.

Moreover, the present resin mold was used 20 times for consecutive thermal nanoimprinting. Imprinting was possible without problems.

The results are shown in Table 5.

Reference Example 2

During step (iv) of Example 1, the resin mold obtained in step (ii-c) was wound upon a roll, and the Lexan film (imprinting region: 21 cm wide, 200 cm long) was pressed at 1.0 MPa. A production line was run (1 m/min travel speed, handmade device) under conditions capable of uniform coating of PAK-02. Thereafter, ultraviolet radiation (70 mW/cm$^2$) was irradiated for 1 second while the line moved. While allowing the resin to cure, continuous roll imprinting was performed for 5 minutes to obtain 5 m of molded film. Thereafter, the resin mold was removed from the roll, and it was confirmed that there were no transfer defects in the mold. Moreover, contact angle was measured by the same method as that of step (iv), and it was confirmed that there was no change. Furthermore, it was confirmed by SEM and AFM that there was no change of geometry in the resin after imprinting. The results are shown in Table 5.

Abbreviations within the table have the below listed meanings.

PET: polyethylene terephthalate
Glass: soda glass
Si wafer: silicon wafer
PSF: polysulfone
PC: polycarbonate
PEN: polyethylene naphthalate
PMMA: polymethylmethacrylate
DLC: polyethylene terephthalate having a surface coating of diamond-like carbon
GC: glassy carbon
SiC: silicon carbide wafer
HD-1100: perfluoropolyether type mold release agent liquid

TABLE 1

| | | | | Example 1 | Example 2 | Example 3 | Example 4 |
|---|---|---|---|---|---|---|---|
| Mold | | Master mold | | colspan=4: I |
| | Substrate | Type | | colspan=4: PET |
| | | Thickness (mm) | | colspan=4: 0.125 |
| | Resin layer | Composition | Constituent monomer of resin | Methyl methacrylate | 95 | 95 | 95 | 90 |
| | | | | Styrene | | | | |
| | | | | Isobornyl methacrylate | | | | |
| | | | | Glycidyl methacrylate | 5 | 5 | 5 | 10 |
| | | | Additive | 3-glycidoxypropyltrimethoxysilane | 5 | 10 | 1 | 5 |
| | | Thickness (μm) | | | 1.2 | 1.2 | 1.2 | 1.2 |
| | | Weight average molecular weight (Mw) | | | 8.3 | 8.3 | 8.3 | 8.5 |
| | Release layer | Mold release agent | | | HD-1100 | HD-1100 | HD-1100 | HD-1100 |
| | | Thickness (nm) | | | 3 | 3 | 3 | 3 |
| | | Standard deviation | | | 0.43 | 0.43 | 0.43 | 0.43 |
| Water contact angle (°) | | | | Before imprinting | 110 | 110 | 110 | 110 |
| | | | | After imprinting | 108 | 108 | 110 | 108 |
| | | | | Rate of change after imprinting (%) | 1.8 | 1.8 | 0.0 | 1.8 |
| Results of imprinting | | | | Macro inspection | ○ | ○ | ○ | ○ |
| | | | | SEM (period) | ○ | ○ | ○ | ○ |
| | | | | AFM (thickness) | ○ | ○ | ○ | ○ |

| | | | | Example 5 | Example 6 | Example 7 | Example 11 | Example 12 |
|---|---|---|---|---|---|---|---|---|
| Mold | | Master mold | | colspan=5: I |
| | PET | Type | | colspan=5: PET |
| | | Thickness (mm) | | colspan=5: 0.125 |
| | Resin layer | Composition | Constituent monomer of resin | Methyl methacrylate | 99 | | | 95 | 95 |
| | | | | Styrene | | 95 | | | |
| | | | | Isobornyl methacrylate | | | 95 | | |
| | | | | Glycidyl methacrylate | 1 | 5 | 5 | 5 | 5 |
| | | | Additive | 3-glycidoxypropyltrimethoxysilane | 5 | 5 | 5 | 5 | 5 |
| | | Thickness (μm) | | | 1.2 | 1.2 | 1.2 | 1.2 | 1.2 |
| | | Weight average molecular weight (Mw) | | | 8.2 | 8.5 | 8.3 | 8.3 | 8.3 |
| | Release Layer | Mold release agent | | | HD-1100 | HD-1100 | HD-1100 | a | b |
| | | Thickness (nm) | | | 3 | 3 | 3 | 3 | 3 |
| | | Standard deviation | | | 0.43 | 0.43 | 0.43 | 0.43 | 0.43 |
| Water contact angle (°) | | | | Before imprinting | 110 | 110 | 110 | 110 | 110 |
| | | | | After imprinting | 110 | 106 | 108 | 108 | 108 |
| | | | | Rate of change after imprinting (%) | 0.0 | 3.6 | 1.8 | 1.8 | 1.8 |
| Results of imprinting | | | | Macro inspection | ○ | ○ | ○ | ○ | ○ |
| | | | | SEM (period) | ○ | ○ | ○ | ○ | ○ |
| | | | | AFM (thickness) | ○ | ○ | ○ | ○ | ○ |

| | | | | Comparative Example 1 | Comparative Example 2 | Comparative Example 3 | Comparative Example 4 |
|---|---|---|---|---|---|---|---|
| Mold | | Master mold | | colspan=4: I |
| | Substrate | Type | | colspan=4: PET |
| | | Thickness (mm) | | colspan=4: 0.125 |
| | Resin layer | Composition | Constituent monomer of resin | Methyl methacrylate | 95 | 95 | 80 | 99.5 |
| | | | | Styrene | | | | |
| | | | | Isobornyl methacrylate | | | | |

TABLE 1-continued

|  |  |  |  |  |  |  |  |
|---|---|---|---|---|---|---|---|
|  |  |  | Glycidyl methacrylate | 5 | 5 | 20 | 0.5 |
|  |  | Additive | 3-glycidoxypropyltrimethoxysilane | 20 | 0.5 | 5 | 5 |
|  | Thickness (μm) |  |  | 1.2 | 1.2 | 1.2 | 1.2 |
|  | Weight average molecular weight (Mw) |  |  | 8.3 | 8.3 | 8.8 | 8.5 |
| Release layer | Mold release agent |  |  | HD-1100 | HD-1100 | HD-1100 | HD-1100 |
|  | Thickness (nm) |  |  | *1 | *2 | *2 | *2 |
|  | Standard deviation |  |  | — | — | — | — |
| Water contact angle (°) |  | Before imprinting |  | — | 72 | 78 | 68 |
|  |  | After imprinting |  | — | — | — | — |
|  |  | Rate of change after imprinting (%) |  | — | — | — | — |
| Results of imprinting |  | Macro inspection |  | — | — | — | — |
|  |  | SEM (period) |  | — | — | — | — |
|  |  | AFM (thickness) |  | — | — | — | — |

*1: Thermal imprinting was not possible, and a resin mold could not be produced.
*2: Unable to measure since there was shedding of the release agent during the rinse step after thermal imprinting. mold release agent
a: perfluoro hexanoic acid
b: 1H,1H,-tridecafluoroheptylamine

TABLE 2

Combinations

|  |  |  |  |  | Example 1 | Example 8 | Example 9 | Example 10 | Comparative Example 5 |
|---|---|---|---|---|---|---|---|---|---|
| Mold | Substrate | Master mold Type |  |  |  |  | I PET |  | I PET |
|  |  | Thickness (mm) |  |  |  |  | 0.125 |  | 0.125 |
|  | Resin layer | Composition of resin | Constituent monomer | Methyl methacrylate | 95 | 95 | 95 | 95 | 95 |
|  |  |  |  | Glycidyl methacrylate | 5 | 5 |  |  |  |
|  |  |  |  | Benzyl methacrylate |  |  | 5 |  | 5 |
|  |  |  |  | Dimethyl aminoethyl methacrylate |  |  |  | 5 |  |
|  |  |  | Additive | 3-glycidoxypropyltrimethoxysilane | 5 |  |  |  | 5 |
|  |  |  |  | 3-glycidoxypropylmethyldimethoxysilane |  | 5 |  |  |  |
|  |  |  |  | Phenyltrimethoxysilane |  |  | 5 |  |  |
|  |  |  |  | 3-aminopropyl trimethoxysilane |  |  |  | 5 |  |
|  |  | Thickness (μm) |  |  | 1.2 | 1.2 | 1.2 | 1.2 | 1.2 |
|  |  | Weight average molecular weight (Mw) |  |  | 8.3 | 8.6 | 8.5 | 8.8 | 8.3 |
|  | Release layer | Mold release agent |  |  | HD-1100 | HD-1100 | HD-1100 | HD-1100 | HD-1100 |
|  |  | Thickness (nm) |  |  | 3 | 3 | 3 | 3 | *1 |
|  |  | Standard deviation |  |  | 0.43 | 0.43 | 0.43 | 0.43 | — |
| Water contact angle (°) |  | Before imprinting |  |  | 110 | 110 | 110 | 110 | 65 |
|  |  | After imprinting |  |  | 108 | 108 | 108 | 110 | — |
|  |  | Rate of change after imprinting (%) |  |  | 1.8 | 1.8 | 1.8 | 0.0 | — |
| Results of imprinting |  | Macro inspection |  |  | ◯ | ◯ | ◯ | ◯ | — |
|  |  | SEM (period) |  |  | ◯ | ◯ | ◯ | ◯ | — |
|  |  | AFM (thickness) |  |  | ◯ | ◯ | ◯ | ◯ | — |

Master mold geometry: I, 576 mm² transferring surface, 150 nm L/S (linear geometry), 300 nm period, 150 nm depth.
*1: Unable to measure since the release layer could not be formed.

TABLE 3

| | | | | Example 1 | Example 13 | Example 14 | Example 15 |
|---|---|---|---|---|---|---|---|
| Shape of the master molds | | | | | | | |
| Master mold | | Mold type | | I | II | III | IV |
| | | Period (nm) | | 300 | 50 | 150 | 20000 |
| | | Geometry | | L/S | L/S | L/S | L/S |
| Mold | Substrate | Type | | PET | | | |
| | | Thickness (mm) | | 0.125 | | | |
| | Resin layer | composition Constituent monomer of resin | Methyl methacrylate | 95 | | | |
| | | | Glycidyl methacrylate | 5 | | | |
| | | Additive | 3-glycidoxypropyltrimethoxysilane | 5 | | | |
| | | Weight average molecular weight (Mw) | | 8.3 | | | |
| | | Thickness (μm) | | 1.2 | | | |
| | Release layer | Mold release agent | | HD-1100 | | | |
| | | Thickness (nm) | | 3 | 3 | 3 | 3 |
| | | Standard deviation | | 0.43 | 0.43 | 0.43 | 0.43 |
| | Water contact angle (°) | | Before imprinting | 110 | 110 | 110 | 110 |
| | | | After imprinting | 108 | 106 | 106 | 106 |
| | | | Rate of change after imprinting (%) | 1.8 | 3.6 | 3.6 | 3.6 |
| Results of imprinting | | | Macro inspection | ○ | ○ | ○ | ○ |
| | | | SEM (period) | ○ | ○ | ○ | ○ |
| | | | AFM (thickness) | ○ | ○ | ○ | ○ |

| | | | | Example 16 | Example 17 | Example 18 |
|---|---|---|---|---|---|---|
| Master mold | | Mold type | | V | VI | VII |
| | | Period (nm) | | 400 | 300 | 20000 |
| | | Geometry | | column | moth-eye | lens |
| Mold | Substrate | Type | | PET | | |
| | | Thickness (mm) | | 0.125 | | |
| | Resin layer | Composition Constituent monomer of resin | Methyl methacrylate | 95 | | |
| | | | Glycidyl methacrylate | 5 | | |
| | | Additive | 3-glycidoxypropyltrimethoxysilane | 5 | | |
| | | Weight average molecular weight (Mw) | | 8.3 | | |
| | | Thickness (μm) | | 1.2 | | 6.4 |
| | Release layer | Mold release agent | | HD-1100 | | |
| | | Thickness (nm) | | 3 | 3 | 3 |
| | | Standard deviation | | 0.43 | 0.43 | 0.43 |
| | Water contact angle (°) | | Before imprinting | 110 | 110 | 110 |
| | | | After imprinting | 106 | 106 | 106 |
| | | | Rate of change after imprinting (%) | 3.6 | 3.6 | 3.6 |
| Results of imprinting | | | Macro inspection | ○ | ○ | ○ |
| | | | SEM (period) | ○ | ○ | ○ |
| | | | AFM (thickness) | ○ | ○ | ○ |

TABLE 4

|  |  |  |  | Example 1 | Example 19 | Example 20 |
|---|---|---|---|---|---|---|
| Master mold |  |  |  |  | I |  |
| Mold | Substrate | Type |  | PET | glass | Si wafer |
|  |  | Thickness (mm) |  | 0.125 | 1.1 | 0.5 |
|  | Resin layer | Composition | Constituent monomer of resin | Methyl methacrylate |  | 95 |
|  |  |  |  | Glycidyl methacrylate |  | 5 |
|  |  | Additive |  | 3-glycidoxypropyltrimethoxysilane |  | 5 |
|  |  | Weight average molecular weight (Mw) |  |  | 8.3 |  |
|  |  | Thickness (μm) |  |  | 1.2 |  |
|  | Release layer | Mold release agent |  |  | HD-1100 |  |
|  |  | Thickness (nm) |  |  | 3 |  |
|  |  | Standard deviation |  |  | 0.43 |  |
|  | Water contact angle (°) | Before imprinting |  | 110 | 110 | 110 |
|  |  | After imprinting |  | 108 | 108 | 108 |
|  |  | Rate of change after imprinting (%) |  | 1.8 | 1.8 | 1.8 |
| Results of imprinting |  | Macro inspection |  | ○ | ○ | ○ |
|  |  | SEM (period) |  | ○ | ○ | ○ |
|  |  | AFM (thickness) |  | ○ | ○ | ○ |

|  |  |  |  | Example 24 | Example 25 | Example 26 |
|---|---|---|---|---|---|---|
| Master mold |  |  |  |  | I |  |
| Mold | Substrate | Type |  | PEN | polyimide | PMMA |
|  |  | Thickness (mm) |  | 0.12 | 0.3 | 0.12 |
|  | Resin layer | Composition | Constituent monomer of resin | Methyl methacrylate |  | 95 |
|  |  |  |  | Glycidyl methacrylate |  | 5 |
|  |  | Additive |  | 3-glycidoxypropyltrimethoxysilane |  | 5 |
|  |  | Weight average molecular weight (Mw) |  |  | 8.3 |  |
|  |  | Thickness (μm) |  |  | 1.2 |  |
|  | Release layer | Mold release agent |  |  | HD-1100 |  |
|  |  | Thickness (nm) |  |  | 3 |  |
|  |  | Standard deviation |  |  | 0.43 |  |
|  | Water contact angle (°) | Before imprinting |  | 110 | 110 | 110 |
|  |  | After imprinting |  | 108 | 108 | 108 |
|  |  | Rate of change after imprinting (%) |  | 1.8 | 1.8 | 1.8 |
| Results of imprinting |  | Macro inspection |  | ○ | ○ | ○ |
|  |  | SEM (period) |  | ○ | ○ | ○ |
|  |  | AFM (thickness) |  | ○ | ○ | ○ |

|  |  |  |  | Example 21 | Example 22 | Example 23 |
|---|---|---|---|---|---|---|
| Master mold |  |  |  |  | I |  |
| Mold | Substrate | Type |  | sapphire | PSF | PC |
|  |  | Thickness (mm) |  | 0.5 | 0.12 | 0.12 |
|  | Resin layer | Composition | Constituent monomer of resin | Methyl methacrylate |  | 95 |
|  |  |  |  | Glycidyl methacrylate |  | 5 |
|  |  | Additive |  | 3-glycidoxypropyltrimethoxysilane |  | 5 |
|  |  | Weight average molecular weight (Mw) |  |  | 8.3 |  |
|  |  | Thickness (μm) |  |  | 1.2 |  |
|  | Release layer | Mold release agent |  |  | HD-1100 |  |
|  |  | Thickness (nm) |  |  | 3 |  |
|  |  | Standard deviation |  |  | 0.43 |  |
|  | Water contact angle (°) | Before imprinting |  | 110 | 110 | 108 |
|  |  | After imprinting |  | 108 | 107 | 106 |

TABLE 4-continued

|  |  |  |  | Example 27 | Example 28 | Example 29 |
|---|---|---|---|---|---|---|
|  |  | Rate of change after imprinting (%) |  | 1.8 | 2.7 | 1.9 |
| Results of imprinting |  | Macro inspection |  | ○ | ○ | ○ |
|  |  | SEM (period) |  | ○ | ○ | ○ |
|  |  | AFM (thickness) |  | ○ | ○ | ○ |

| Master mold |  |  |  |  |  | I |  |
|---|---|---|---|---|---|---|---|
| Mold | Substrate | Type |  |  | DLC | GC | SiC |
|  |  | Thickness (mm) |  |  | 0.12 | 1 | 0.43 |
|  | Resin layer | Composition | Constituent monomer of resin | Methyl methacrylate |  | 95 |  |
|  |  |  |  | Glycidyl methacrylate |  | 5 |  |
|  |  |  | Additive | 3-glycidoxypropyltrimethoxysilane |  | 5 |  |
|  |  | Weight average molecular weight (Mw) |  |  |  | 8.3 |  |
|  |  | Thickness (μm) |  |  |  | 1.2 |  |
|  | Release layer | Mold release agent |  |  |  | HD-1100 |  |
|  |  | Thickness (nm) |  |  |  | 3 |  |
|  |  | Standard deviation |  |  |  | 0.43 |  |
|  | Water contact angle (°) |  | Before imprinting |  | 110 | 110 | 110 |
|  |  |  | After imprinting |  | 107 | 108 | 108 |
|  |  |  | Rate of change after imprinting (%) |  | 2.7 | 1.8 | 1.8 |
| Results of imprinting |  | Macro inspection |  |  | ○ | ○ | ○ |
|  |  | SEM (period) |  |  | ○ | ○ | ○ |
|  |  | AFM (thickness) |  |  | ○ | ○ | ○ |

TABLE 5

Examples of Use

|  |  |  |  |  | Example 1 | Reference Example 1 | Reference Example 2 |
|---|---|---|---|---|---|---|---|
| Master mold |  |  |  |  |  | I |  |
| Mold configuration | Substrate | Type |  |  |  | PET |  |
|  |  | Thickness (mm) |  |  |  | 0.125 |  |
|  | Resin layer | Composition | Constituent monomer of resin | Methyl methacrylate |  | 95 |  |
|  |  |  |  | Glycidyl methacrylate |  | 5 |  |
|  |  |  | Additive | 3-glycidoxypropyltrimethoxysilane |  | 5 |  |
|  |  | Weight average molecular weight (Mw) |  |  |  | 8.3 |  |
|  |  | Thickness (μm) |  |  |  | 1.2 |  |
|  | Release layer | Mold release agent |  |  |  | HD-1100 |  |
|  |  | Thickness (nm) |  |  |  | 3 |  |
|  |  | Standard deviation |  |  |  | 0.43 |  |
|  | Water contact angle (°) |  | Before imprinting |  | 110 | 110 | 110 |
|  |  |  | After imprinting |  | 108 | 108 | 108 |
|  |  |  | Rate of change after imprinting (%) |  | 1.8 | 1.8 | 1.8 |
| Nano printing method |  |  |  |  | UV/batch (sheet) | heat/batch (sheet) | UV/continuous (roll) |
| Results of imprinting |  | Macro inspection |  |  | ○ | ○ | ○ |
|  |  | SEM (period) |  |  | ○ | ○ | ○ |
|  |  | AFM (thickness) |  |  | ○ | ○ | ○ |

The resin mold of the present invention is used for imprinting of a thermoplastic resin, thermosetting resin, or photo-curable resin.

The various products obtained from the imprinted resin may be used as semiconductor materials, optical elements, prisms, micro lenses, memory media, holography, micro machines, biotechnology, environmental technology, and electronic materials such as semiconductors, LEDs, hard discs, or the like.

The invention claimed is:

1. A resin mold comprising:
   a substrate,
   a resin layer formed upon the substrate and having a depressions and protrusions pattern formed on the surface of the resin layer,
   and a release layer containing a mold release agent and being formed with uniform thickness on at least the surface of the depressions and protrusions pattern of said resin layer;
   wherein said resin layer comprises a solvent soluble resin and an additive; the additive contains a substituent group capable of coupling with said mold release agent and a substituent group having compatibility with said solvent soluble resin and has bleeding ability with respect to the solvent soluble resin;
   said additive is localized in the vicinity of said resin layer surface and the substituent group capable of coupling with the mold release agent contained in the additive bonds chemically with said mold release agent to couple together said resin layer and release layer,
   wherein said additive is a compound, or hydrolysate thereof, indicated by the below listed General Formula (1):

$$Y_{3-n}(CH_3)_n SiX \quad (1)$$

wherein General Formula (1), Y is a methoxy or ethoxy group; X is an organic group including one type selected from the group consisting of an epoxy group, glycidoxy group, and optionally substituted phenyl group or amino group; and n is 0 or 1, and
   wherein the content of said additive within said resin layer is from 1 to 13 percent by weight and wherein a total percent by weight of the solvent soluble resin and additive is 100 percent by weight.

2. The resin mold according to claim 1, wherein the pure water contact angle of said release layer surface is greater than or equal to 100 degrees.

3. The resin mold according to claim 1, wherein said solvent soluble resin has a constituent unit having a substituent group of the same type as X in said General Formula (1).

4. The resin mold according to claim 3, wherein, in said solvent soluble resin, the content of the constituent unit having the substituent group of the same type as X in said General Formula (1) is from 1 to 15 percent by weight.

5. The resin mold according to claim 1, wherein said substituent group of said additive having compatibility with said solvent soluble resin is the substituent group X in said General Formula (1).

6. The resin mold according to claim 1, wherein said substituent group of said additive capable of coupling with said mold release agent is the substituent group Y in said General Formula (1) or a hydrolysate of such substituent group Y.

7. The resin mold according to claim 1, wherein said mold release agent is at least one type selected from the group consisting of fluorine-based silane coupling agents, mono-terminal aminated perfluoro (perfluoroether) compounds, and mono-terminal carboxylated perfluoro (perfluoroether) compounds.

8. The resin mold according to claim 1, wherein said substrate is a resin substrate, glass substrate, silicon substrate, sapphire substrate, carbon substrate, or GaN substrate.

9. The resin mold according to claim 8, wherein said resin substrate is one type of resin selected from the group consisting of: polyethylene terephthalate, polycarbonates, polymethylmethacrylates, polyimides, polysulfones, polyether sulfones, cyclic polyolefins, and polyethylene naphthalates.

10. The resin mold according to claim 1, wherein period of the depressions and protrusions pattern of the surface is from 10 nm to 50 μm.

11. The resin mold according to claim 1, wherein shape of the depressions and protrusions pattern of the surface is linear shaped, columnar shaped, moth-eye-pattern shaped, or lens shaped.

12. A method of use of a resin mold comprising steps of:
    contacting the resin surface against the resin mold according to claim 1;
    and pealing said resin mold from said resin.

13. The method of use of a resin mold according to claim 12, wherein said resin is a photo-curable resin.

14. The resin mold according to claim 1, wherein the resin mold is fixed to a roller.

15. The resin mold according to claim 1, wherein the depressions and protrusions pattern is a pattern for imprinting.

* * * * *